United States Patent

Rich

[11] Patent Number: 5,333,723
[45] Date of Patent: Aug. 2, 1994

[54] ACCUMULATOR PADDLE APPARATUS

[76] Inventor: Dennis E. Rich, 8050 S. 1300 West, West Jordan, Utah 84088

[21] Appl. No.: 82,483

[22] Filed: Jun. 28, 1993

[51] Int. Cl.$^5$ .............................................. B65G 15/44
[52] U.S. Cl. .............................. 198/484.1; 198/688.1; 198/690.2; 198/803.13
[58] Field of Search ........... 198/803.13, 484.1, 803.01, 198/688.1, 690.2

[56] References Cited

U.S. PATENT DOCUMENTS

| | | | |
|---|---|---|---|
| 1,810,859 | 6/1931 | Thurmer | 198/803.13 X |
| 1,864,415 | 6/1932 | Clark | 198/803.13 |
| 3,245,518 | 4/1966 | Leibel et al. | 198/803.13 X |
| 3,960,264 | 6/1976 | Carbine et al. | 198/803.01 X |
| 4,143,759 | 3/1979 | Paradis | 198/690.2 |
| 4,723,652 | 2/1988 | Rich | 198/803.13 |
| 5,050,318 | 9/1991 | Du Bruyn | 198/803.13 X |

FOREIGN PATENT DOCUMENTS 2594810  8/1987  France ........................... 198/803.13

*Primary Examiner*—Cheryl L. Gastineau
*Attorney, Agent, or Firm*—H. Gordon Shields

[57] ABSTRACT

Paddle apparatus for an accumulator for receiving and transporting printed circuit panels including a plurality of tip elements and caps are distributed on the tip elements. The caps act as cushion elements to prevent inadvertent damage to the printed circuit panels and for providing sufficient friction to help maintain the circuit panels in place in the accumulator apparatus as the circuit panels are moved.

17 Claims, 2 Drawing Sheets

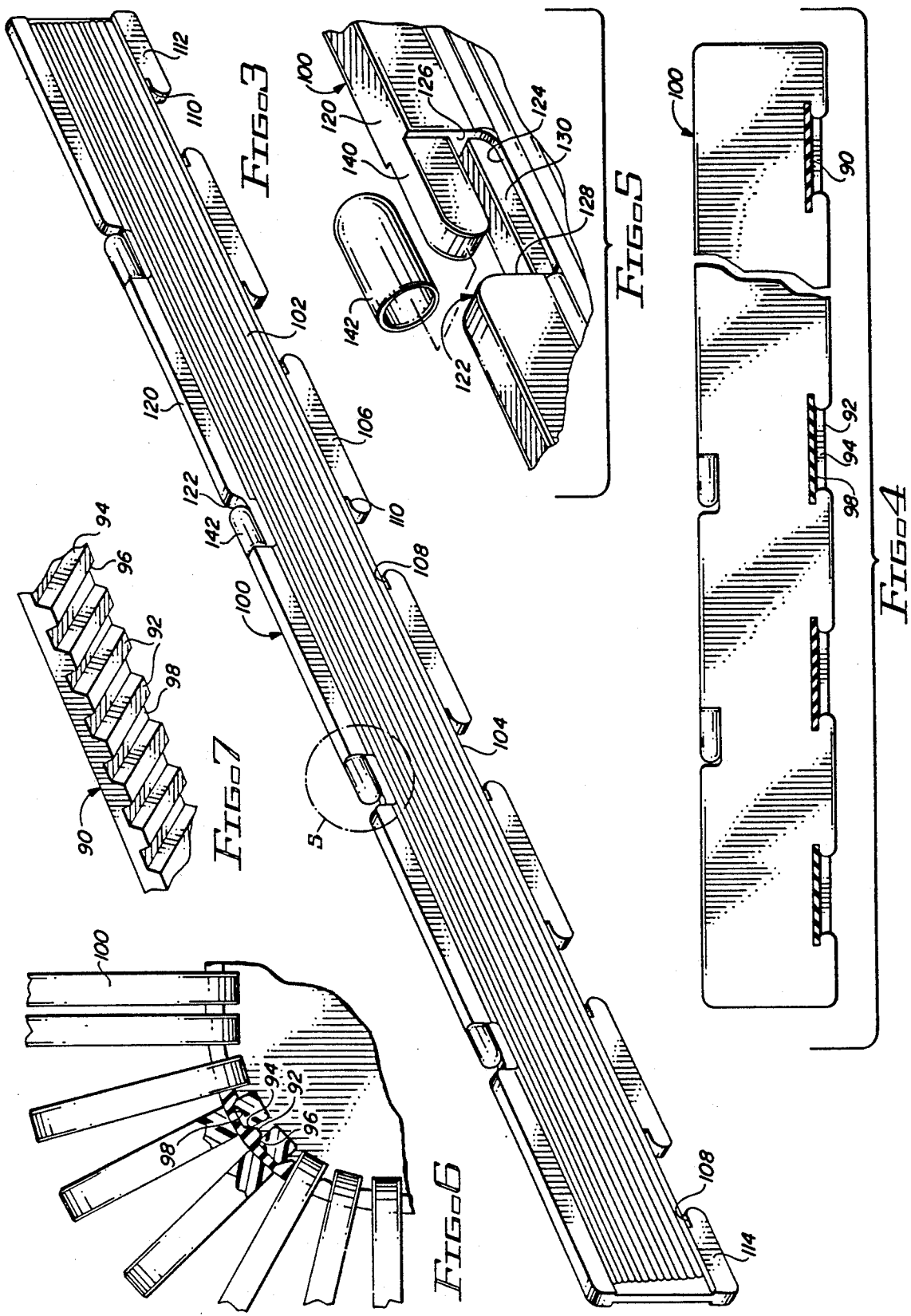

ACCUMULATOR PADDLE APPARATUS

BACKGROUND OF THE INVENTION

1. Field of the Invention

This invention relates to accumulator apparatus for accumulating printed circuit boards or panels, and, more particularly, to paddles movable on the accumulator apparatus and between which printed circuit boards or panels are disposed for moving the boards or panels.

2. Description of the Prior Art

U.S. Pat. No. 4,723,652, the patentee of which is the inventor herein, describes an accumulator for receiving and transporting printed circuit boards. The accumulator apparatus of the '652 patent utilizes paddles, and the paddles are shown or are illustrated relatively generally except for particular elements utilized in securing the paddles to a timing belt or the like which cooperates with gear elements for moving the timing belt and the paddles and, concomitantly, the printed circuit boards disposed between paddles.

The apparatus of the present invention discloses a particular configuration of an accumulator paddle which includes elements for helping to maintain the printed circuit boards in the accumulator and for supporting and cushioning the printed circuit boards while they are disposed between paddles and are being transported.

SUMMARY OF THE INVENTION

The invention described and claimed herein comprises a paddle for a circuit board or panels handling accumulator apparatus and the paddle includes elements for securing the paddle to a timing belt and it includes a plurality of integral tips to which cushion elements are secured. The cushion elements have a relatively high coefficient of friction and accordingly help to maintain the printed circuit boards or panels in the accumulator apparatus during the movement of the printed circuit boards by the accumulator apparatus.

Among the objects of the present invention are the following:

To provide new and useful paddle apparatus for an accumulator;

To provide new and useful paddles between which a printed circuit board may be disposed;

To provide new and useful accumulator paddle apparatus having a plurality of fingers;

To provide new and useful paddle apparatus having a plurality of tips and having cushion elements on the tips; and To provide new and useful tip elements usable on an accumulator paddle for cushioning a circuit board disposed against the paddle and for providing friction for preventing the circuit board from moving relative to the paddle apparatus.

BRIEF DESCRIPTION OF THE DRAWING

FIG. 3 is a perspective view of a paddle of the present invention.

FIG. 4 is a view in partial section taken generally along line 4—4 of FIG. 2.

FIG. 5 is an enlarged perspective view taken generally from circle 5 of FIG. 3.

FIG. 6 is an enlarged view in partial section taken generally from circle 6 of FIG. 2.

FIG. 7 is a perspective view of a portion of a belt usable with the apparatus of the present invention.

DESCRIPTION OF THE PREFERRED EMBODIMENT

Figure 1:
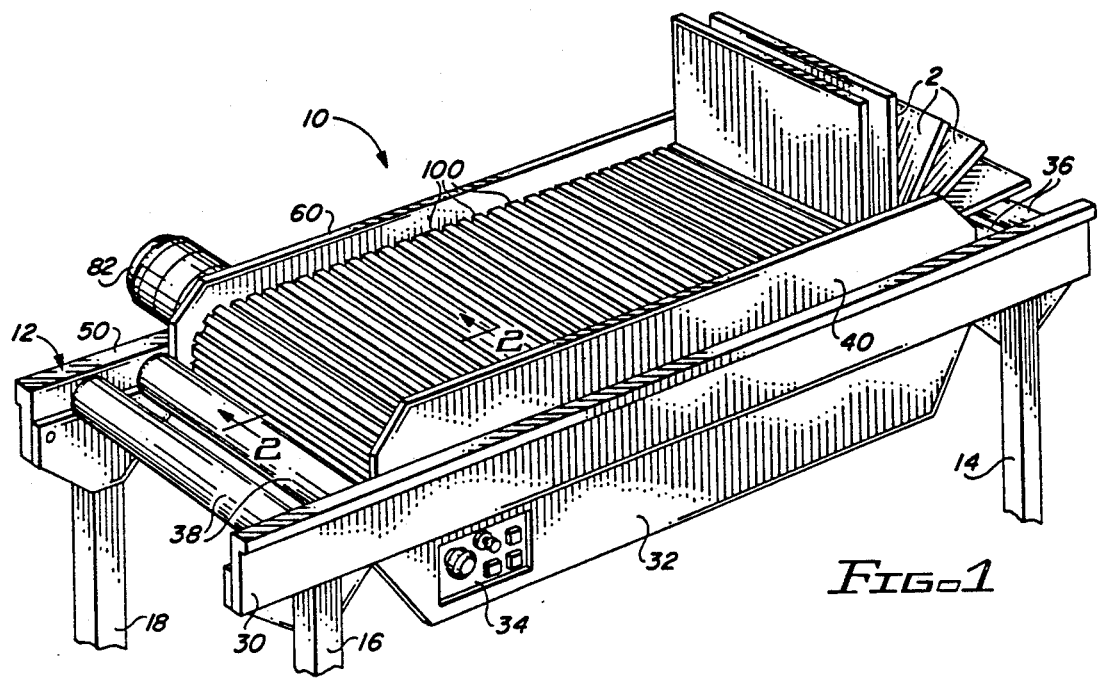
FIG. 1 is a perspective view of apparatus of the present invention in its use environment.
Figure 2:
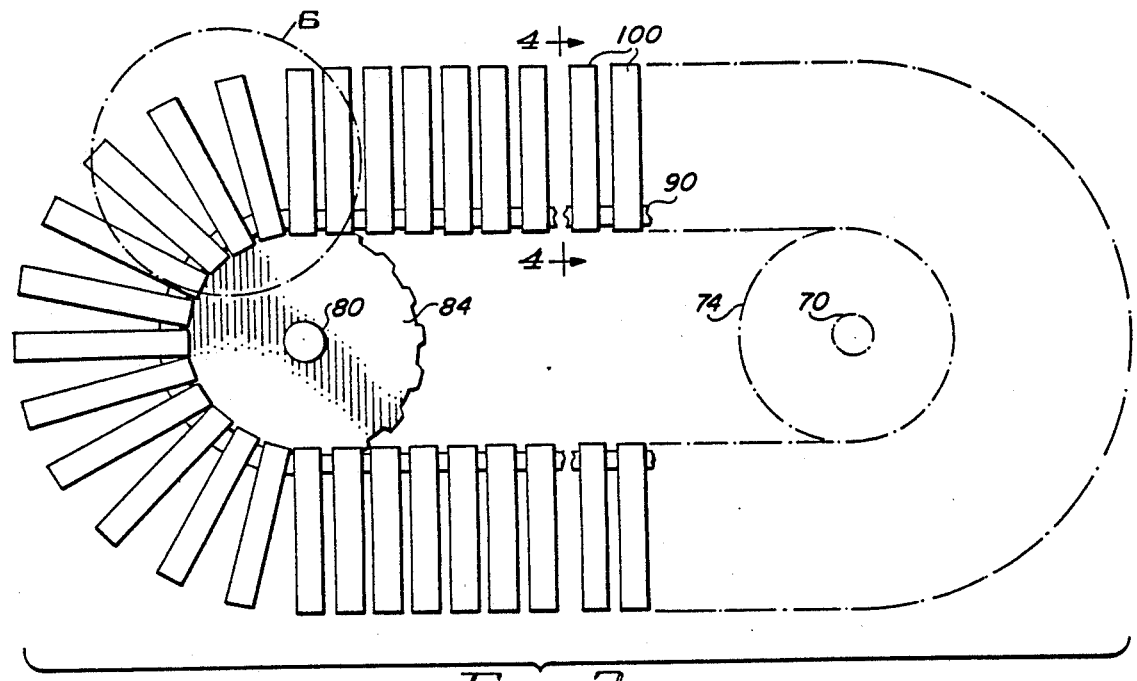
FIG. 2 is a view taken generally along line 2—2 of FIG. 1.

FIG. 1 is a perspective view of accumulator apparatus 10 of the present invention. FIG. 2 is a side view of a plurality of paddles 100 secured to a timing belt 90, with the belt 90 disposed about a pair of gears appropriately secured to rotatable shafts.

FIGS. 3 and 4 comprise views of the a paddle 100, with FIG. 3 comprising a perspective view and FIG. 4 comprising a front view. An enlarged portion of a paddle is shown in FIG. 5. FIG. 5 is taken generally from circle 5 of FIG. 3.

Details of securing the paddles 100 to the belt 90 are shown in FIGS. 6 and 7. FIG. 6 comprises an enlarged view taken generally from circle 6 of FIG. 2, with portions of the belt 90 and a paddle 100 shown in partial section. FIG. 7 is a perspective bottom view of a portion of a belt 90 showing structural features of the belt.

For the following discussion of the accumulator apparatus 10, attention will be directed to all of the figures, with special attention specifically noted as appropriate.

The accumulator apparatus 10, best shown in FIG. 1, includes a table 12 supported by four legs. Three of the legs, a leg 14, a leg 16, and a leg 18, are shown. The table 12 includes two side rails, including a side rail 30 and a side rail 50. The legs are appropriately secured to the side rails.

Extending downwardly from the side rails are skirts, including a skirt 32 which extends downwardly from the side rail 30. A control panel 34 is shown in the skirt 32.

Extending upwardly from the side rails are a pair of side panels. A side panel 40 extends upwardly from the rail 30, and a side panel 60 extends upwardly from the side rail 50. The side rails, side panels, and skirts, are structural members to which is secured various elements involved in the accumulator apparatus 10.

A plurality of paddles 100 are shown in FIG. 1 as being disposed between the side panels 40 and 60. The paddles 100 are secured to a timing belt 90. Details of the timing belt 90 are shown in FIGS. 4, 6, and 7, in addition to the showing of FIG. 2.

The timing belt 90 moves on toothed gear elements, a pair of which are shown in FIG. 2. A toothed gear 74, secured to a shaft 70, are shown in phantom in FIG. 2, while a toothed gear 84 secured to a shaft 80 is shown in solid line in FIG. 2.

A stepping or stepper drive motor 82, shown in FIG. 1, is operatively connected to the shaft 80 for driving the gear 84. The motor 82 moves the shaft 80 incrementally, and the belt 90 accordingly moves incrementally in response to the movement of the shaft 80 and the gear 84 secured to the shaft. The gear 84 in turn causes the endless timing belt 90 to move, and the paddles 100, which are secured to the timing belt 90, accordingly move therewith. In FIG. 1, a plurality of printed circuit boards 2 are shown disposed between paddles for movement therewith.

Details of the paddles are best shown in FIGS. 3, 4, and 5, and attention will be directed primarily to those Figures for the following discussion.

Each paddle 100 is a generally elongated element having a length substantially greater than its height. The paddles include a central portion 102 which is transversely ribbed or fluted. It will be noted that the laterally extending ribs or flutes in the paddle 100 provide two functions. The ribs or flutes serve to lighten each paddle since they comprised relieved portions from which material, such as plastic, has been removed. They further serve as frictional engagement elements to help hold the printed circuit boards in place.

It will be obvious that there may be vertically extending flutes or notches, if desired, as an alternative to the laterally extending flutes or ribs. Or the vertically extending flutes or ribs may be in addition to the horizontal ones to provide a checkered outer surface for each paddle.

The paddle includes a flat bottom 104. Extending downwardly from the flat bottom, and appropriately spaced apart, are belt engagement elements 106. The belt engagement elements are relatively short elements which have a substantial length. At the top of each engagement element, and at the ends thereof, is a pair of notches 108 and 110. There are two end engagement elements. For descriptive purposes, there is a right end engagement element 112 with only a single notch 110, and a left end engagement element 114, with only a single notch 108. The central elements 106, or the elements between the end elements, each include the two notches, a right notch 108 and a left notch 110. The notches 108 and 110 make appropriate contact with the belt 90, as best shown in FIGS. 4, 6, and 7, and which will be discussed in more detail below.

The paddles 100 also include a top surface 120. The top surface is relatively flat, and generally parallel to the flat bottom surface 104.

Spaced apart periodically on the top surface 120, and extending downwardly therefrom, is a plurality of notches 122. Each notch includes a bottom 124 and a pair of side walls 126 and 128. A boss 130 extends upwardly from the bottom surface 124 and extends between the side walls 126 and 128. The boss 130 is relatively short, and has a width that is less than the width or thickness of the paddle 100. This is best shown in FIG. 5.

A finger 140 extends into the notch 122. The finger 140 has a top surface which is essentially a continuation of the top surface 120 of paddle 100. However, the width or thickness of the finger 140 is generally about the same as the width or thickness of the boss 130.

The finger 140 extends only partway into the notch 122, and is disposed above the boss 130. The finger 140 is covered by a sleeve or tip 142. The sleeve or tip 142 has a relatively high coefficient of friction and has a thickness which is slightly greater than the distance between the finger and the side surfaces of the paddle 100 such that the combined width or thickness of the finger 140 and the sleeve 142 is slightly greater than the width or thickness of each paddle. The sleeve or tip 142 accordingly extends slightly outwardly into the space between adjacent paddles, and slightly outwardly from the paddle 100 itself.

The sleeve or tip 142 serves two functions. Its primary function is that of a cushioning element to help cushion the printed circuit boards 2 (see FIG. 1), and it also serves as a hold element in that the coefficient of friction of the outer surface of the sleeve 142 is relatively high so as to help hold the circuit boards in place between the paddles.

The timing belt 90, best shown in FIG. 7, includes a plurality of spaced apart lands 92 alternating with grooves 98. From the land 92, there are sloping sides 94 and 96 which extend from the land 92 to the groove 98.

The notches 108 and 110 extend into the groove 98, as best shown in FIG. 6. Thus, each paddle 100 is held in place by the engagement of the notches 108 and 110 with the grooves 98, and the lands essentially defined the spacing between adjacent paddles 100.

As best shown in FIG. 4, and as may be understood from FIG. 3, there are actually about six timing belts 90 to which each paddle 100 is secured. Accordingly, in referring again to FIG. 2, there are six generally parallel and aligned gears 84 (and 74) secured to the shaft 80 (and the shaft 70 respectively) for moving the paddle 100, and accordingly for moving the printed circuit boards 2.

The belt 90 is an endless timing belt, and accordingly, it may move continuously. The paddles 100 are secured to the belt 90, for accumulating and moving the printed circuit boards 2 along the length of the table 12. This may be understood from FIGS. 1 and 2.

It will be noted that there are rollers extending between the side rails 30 and 50 at each end of the table 12. The rollers appropriately guide the printed circuit boards to the belt 90 and paddles 100 and then away from the belt and paddles at the opposite end of the table 12. At the right end of the table 10 are shown two rollers 36, and at the left end of the table 10 are shown two rollers 38.

While the principles of the invention have been made clear in illustrative embodiments, there will be immediately obvious to those skilled in the art many modifications of structure, arrangement, proportions, the elements, materials, and components used in the practice of the invention, and otherwise, which are particularly adapted to specific environments and operative requirements without departing from those principles. The appended claims are intended to cover and embrace any and all such modifications, within the limits only of the true spirit and scope of the invention.

What I claim is:

1. Accumulator paddle apparatus for printed circuit panels comprising in combination:
   a paddle having a top and a bottom,
   a plurality of ribs on the paddle for providing friction for holding a printed circuit panel,
   notch means extending upwardly into the paddle from the bottom for engaging a belt, and
   finger means adjacent to the top for engaging a printed circuit panel.

2. The apparatus of claim 1 in which the finger means includes
   a notch extending downwardly from the top,
   a finger extending into the notch, and
   a sleeve disposed on the finger for cushioning and frictionally engaging the printed circuit panel.

3. The apparatus of claim 1 in which the paddle also has a pair of sides, and the ribs extend generally horizontally between the sides.

4. The apparatus of claim 1 in which the finger means includes a plurality of fingers disposed generally parallel to the top of the paddle.

5. Accumulator paddle apparatus for accumulating printed circuit panels comprising in combination:
   belt means for moving printed circuit panels;
   paddle means secured to the belt means and spaced apart from each other for receiving and holding the plurality of printed circuit panels, including a paddle having a ribbed portion against which a printed circuit panel is disposed;

frame means for supporting the belt means; and means for moving the belt means and the printed circuit panels disposed on the belt means relative to the frame means.

6. The apparatus of claim 5 in which the belt means comprises an endless belt having a plurality of alternating lands and grooves extending transversely across the belt 7. The apparatus of claim 6 in which the means for moving the belt means and the printed circuit panels includes gear means secured to the frame means and a motor operatively connected to the gear means for rotating the gear means.

8. The apparatus of claim 7 in which the gear means meshes with the lands and the grooves of the belt means for moving the belt means and the printed circuit panels.

9. The apparatus of claim 8 in which the motor is a stepping motor for incrementally moving the belt means.

10. The apparatus of claim 6 in which the paddle means includes a notch for engaging a groove on the belt means.

11. The apparatus of claim 6 in which the paddle means includes a paddle having a top, a notch extending downwardly from the top, a finger extending into the notch, and a sleeve disposed on the finger for frictionally contacting a printed circuit panel.

12. The apparatus of claim 11 in which the paddle of the paddle means further includes a bottom spaced apart from the top, and a notch extending upwardly from the bottom, and the notch matingly engages the belt means to secure the paddle to the belt means.

13. The apparatus of claim 5 in which the belt means includes a plurality of endless belts disposed generally parallel to each other, and the paddle means includes a plurality of paddles, and each paddle of the plurality of paddles is secured to each belt of the plurality of belts.

14. The apparatus of claim 13 in which the each belt includes a plurality of grooves for receiving a plurality of paddles.

15. The apparatus of claim 14 in which each paddle includes a plurality of notches for engaging grooves the on the belts.

16. The apparatus of claim 5 in which the frame means includes first roller means for moving the printed circuit panels to the belt means and the paddle means.

17. The apparatus of claim 16 in which the frame means further includes second roller means remote from the first roller means for moving the printed circuit panels from the belt means and the paddle means.

* * * * *